United States Patent [19]
Iyer et al.

[11] Patent Number: 5,736,455
[45] Date of Patent: Apr. 7, 1998

[54] METHOD FOR PASSIVATING THE SIDEWALLS OF A TUNGSTEN WORD LINE

[75] Inventors: Ravi Iyer; Pai Hung Pan, both of Boise, Id.

[73] Assignee: Micron Technology, Inc., Boise, Id.

[21] Appl. No.: 577,856

[22] Filed: Dec. 22, 1995

[51] Int. Cl.⁶ .................... H01L 21/283; H01L 21/336
[52] U.S. Cl. ................. 138/592; 438/596; 438/653; 438/655; 438/656
[58] Field of Search ........................ 438/592, 596, 438/643, 648, 649, 655, 656, 683, 787; 257/412, 413

[56] References Cited

U.S. PATENT DOCUMENTS

| | | | |
|---|---|---|---|
| 4,716,131 | 12/1987 | Okazawa et al. | 438/592 |
| 5,003,375 | 3/1991 | Ichikawa | 438/592 |
| 5,227,320 | 7/1993 | Johnson et al. | 438/592 |
| 5,341,016 | 8/1994 | Prall et al. | 257/412 |
| 5,364,803 | 11/1994 | Lur et al. | 438/592 |
| 5,600,153 | 2/1997 | Manning | 257/412 |

*Primary Examiner*—T. N. Quach
*Attorney, Agent, or Firm*—Fillmore, Belliston & Israelsen; Angus C. Fox, III

[57] ABSTRACT

This invention embodies a process for passivating the edges of a tungsten metal layer within a word line stack. After the word line stack is patterned (i.e., formed by masking and etching the stack of globally-deposited layers) as shown in FIG. 1, a conformal silicon film is blanket deposited. Deposition of the silicon film may be accomplished by any available technique, such as chemical vapor deposition or plasma-enhanced chemical vapor deposition. The wafer is then heated so that the tungsten in contact with the silicon film is converted to tungsten silicide. In a preferred embodiment of the invention, only a portion of the silicon film is allowed to react with the edge of the tungsten layer. The remainder of the silicon film is converted to silicon dioxide by subjecting the wafer $O_2$ in a furnace or rapid thermal processing chamber. Alternatively, the remainder of the silicon film may be converted to silicon dioxide by subjecting the wafer to $O_2$ or $O_3$ in a plasma reactor. In an alternative but equivalent embodiment of the process, the tungsten metal is converted to tungsten silicide and the remainder of the silicon film is converted to silicon dioxide using a single piece of equipment. This is done by first heating the wafer in a nitrogen-containing ambiance, and then ramping the temperature upward and replacing the nitrogen-containing ambiance with an oxidizing ambiance.

27 Claims, 3 Drawing Sheets

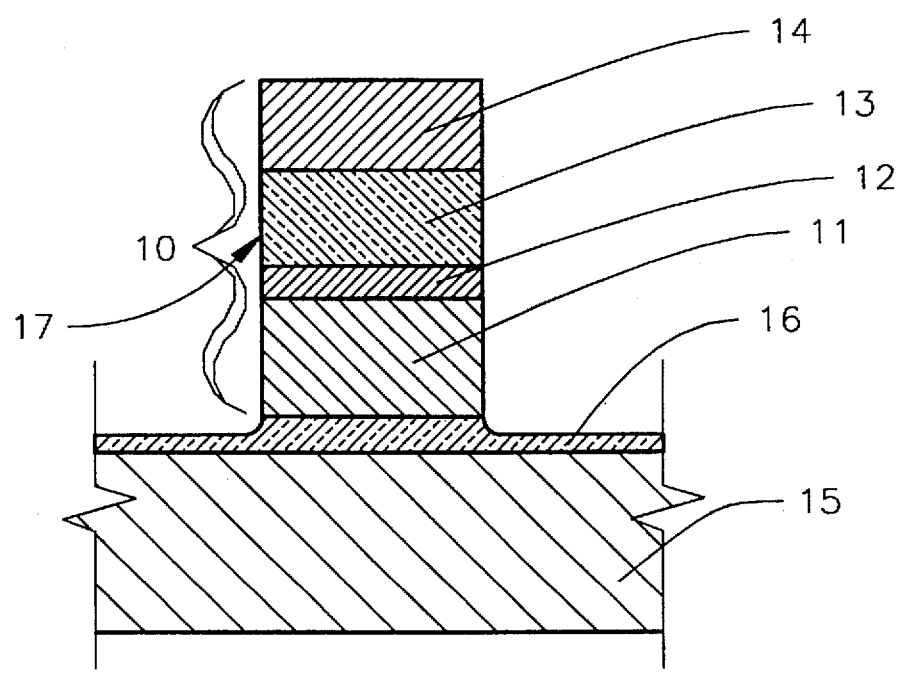
FIG.: 1

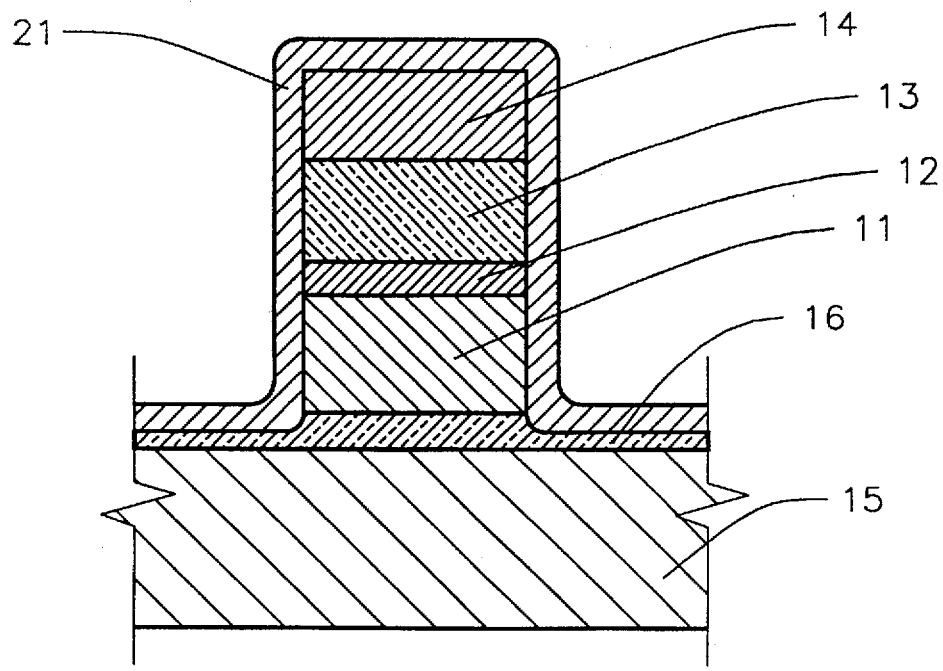
FIG.: 2
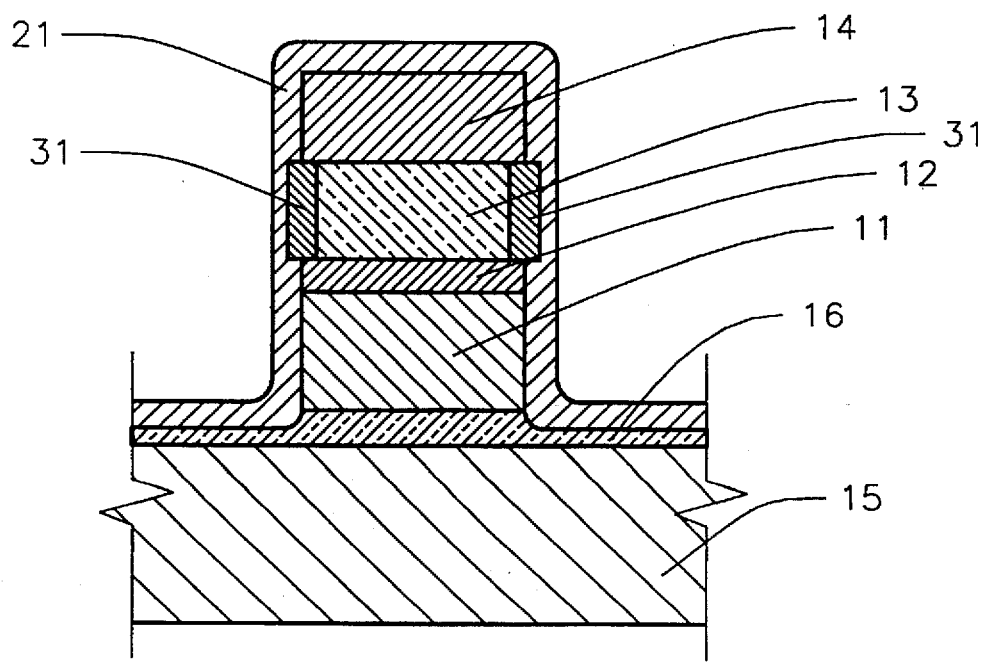
FIG.: 3

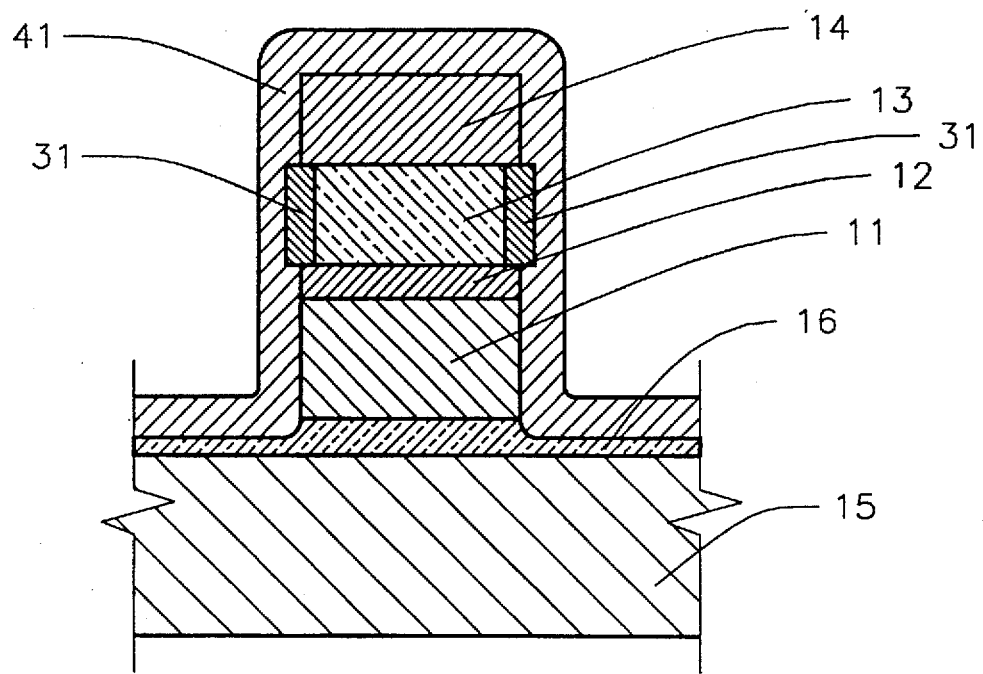
FIG.: 4
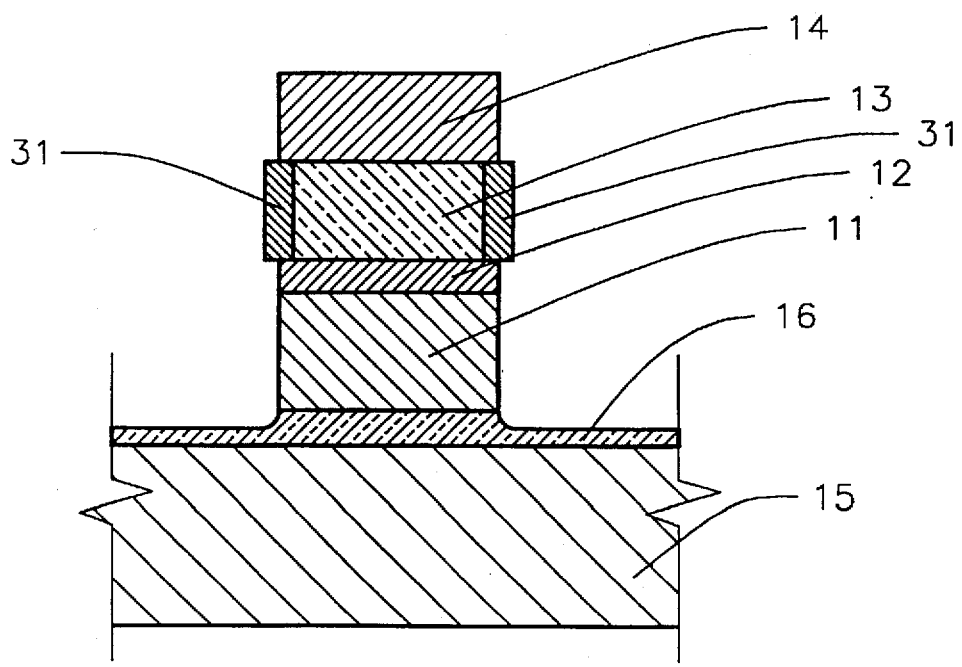
FIG.: 5

METHOD FOR PASSIVATING THE SIDEWALLS OF A TUNGSTEN WORD LINE

This application is related to U.S. application Ser. No. 08/572,164, entitled "METHOD FOR DEPOSITING A TUNGSTEN LAYER ON SILICON", which was filed simultaneously with the present application.

FIELD OF THE INVENTION

This invention relates to the fabrication of integrated circuits and, more particularly, to the use of tungsten metal as the primary current carrier for a word line stack.

BACKGROUND INFORMATION

In the manufacture of integrated circuits, both field-effect transistor gate electrodes and gate electrode interconnects are typically etched from a uniformly-thick conductive layer that blankets the in-process circuitry. In semiconductor memory circuits, word lines which are formed from a uniformly-thick conductive layer which blankets the circuitry form both gate electrodes and gate interconnects. Wherever a word line passes over a field oxide region, it functions as a gate electrode interconnect; wherever it passes over a gate dielectric layer that overlies an active area, it functions as a gate electrode. In typical circuits, whether they be memory circuits, processor circuits or logic circuits, multiple gate electrodes are series coupled by intervening gate interconnects. In other words, the gate electrode/gate interconnect structures seen in memory circuits closely resemble those found in other types of integrated circuits.

For early generations of integrated circuits, gate electrodes and electrodes interconnects were typically etched from a heavily-doped polycrystalline silicon ("polysilicon") layer. However, in order to achieve increased operational speeds and lower stack heights in subsequent generations of circuits, it became necessary to decrease the sheet resistance of the conductive layer from which the gates and gates and interconnects were formed.

A significant improvement in the conductivity of gate electrodes and gate interconnects was realized by forming a low-resistance metal silicide layer on top of the electrode/interconnect layer. A silicide is a binary compound formed by the reaction of a metal and silicon at elevated temperature. As integrated circuit processing generally requires a series of elevated temperature steps, metals having high melting points are preferred for structures, such as gates, which are created early in the fabrication process. A metal layer applied at the end of the fabrication process need not possess a particularly high melting point. Thus, aluminum, which has a melting point of only 660° C., is typically used only for upper level interconnect lines, and is applied to the circuitry only after no further processing of the wafer in excess of about 600° C. is required. The group of refractory metals is generally considered to include tungsten (melting point 3410° C.), titanium (m.p. 1675° C.), platinum (m.p. 1774° C.), palladium (m.p. 1549° C.), cobalt (m.p. 1495° C.), molybdenum (m.p. 2620° C.), nickel (m.p. 1455° C.), rhodium 1966° C.) and iridium (m.p. 2454° C.). Because of considerations related to cost and ease of deposition, silicides of tungsten and titanium are the most widely used for integrated circuit applications. Generally, a metal silicide conductor within an integrated circuit is formed by one of two methods. The first method involves depositing (usually by reactive sputtering) a metal silicide layer on top of a previously deposited polysilicon layer and annealing the resulting stack to break up the native oxide layer on the surface of the polysilicon layer (which enhances adhesion of the silicide layer to the polysilicon layer and also ensures adequate electrical interconnection between the two layers). The second method, on the other hand, involves depositing a metal layer (by either reactive sputtering or by chemical vapor deposition) on top of a previously deposited polysilicon layer and annealing the resulting stack to react the metal layer with a portion of the polysilicon layer (which, of course, also eliminates the native oxide layer on the polysilicon). Although metal silicides have significantly higher conductivity than heavily-doped silicon, a silicide is about an order of magnitude more resistive than the pure metal from which it is formed.

In the quest of faster operational speeds (required for high-speed processor and memory circuits) and reduced stack heights (in the interest of enhanced planarity and, thus, better photolithographic resolution over the entire circuit), integrated circuit manufacturers are investigating the use of pure metal layers to enhance the conductivity of polysilicon transistor gates and gate interconnects. Tungsten is of particular interest because it is relatively inexpensive, has a very high melting point, and is known to be compatible with current circuit manufacturing processes. However, the deposition of tungsten metal directly on silicon results in tungsten layers having extremely poor thickness uniformity. Such non-uniformity most likely results from the formation of tungsten silicide islands as silicon diffuses into the tungsten layer at the polysilicon/tungsten interface. The referenced patent application entitled "METHOD FOR DEPOSITING A TUNGSTEN LAYER ON SILICON" discloses a method for depositing tungsten metal on silicon which ameliorates the poor uniformity characteristics of a tungsten metal layer deposited directly on silicon.

FIG. 1 depicts a word line stack 10 comprising a polysilicon layer 11, a conductive barrier layer 12 such as tungsten nitride or titanium nitride, a tungsten metal layer 13, and a silicon dioxide capping layer 14. The word line stack 10 overlies a silicon substrate 15 which is a small portion of a silicon wafer. Polysilicon layer 11 of word line stack 10 is insulated from the substrate 15 by a gate dielectric layer 16. The use of unreacted tungsten metal as a word line conductive layer creates additional problems during the fabrication process. The word line materials must be able to withstand high temperature processing in an oxidizing environment. For example, shortly after the word line stack 10 of FIG. 1 is patterned, a source/drain reoxidation step is performed which. The source/drain reoxidation step reduces the electric field strength at the gate edge by upwardly chamfering the edge, thereby reducing the "hot electron" effect that is responsible for threshold voltage shifts. Unfortunately, tungsten at the exposed edges of layer 13 is rapidly converted to tungsten trioxide gas at high temperature in the presence of oxygen. As tungsten trioxide undergoes sublimation as it is formed at high temperatures, the oxidation of a tungsten surface is not self limiting. Therefore, a primary objective of the present invention is the development of a process which passivates the edges of the tungsten metal layer within such a word line stack.

SUMMARY OF THE INVENTION

This invention embodies a process for passivating the edges of a tungsten metal layer within a word line stack. After the word line stack is patterned (i.e., formed by masking and etching the stack of globally-deposited layers) as shown in FIG. 1, a conformal silicon film is blanket deposited. Deposition of the silicon film may be accomplished by any available technique, such as chemical vapor deposition or plasma-enhanced chemical vapor deposition. The wafer is then heated so that the tungsten in contact with the silicon film is converted to tungsten silicide. In a preferred embodiment of the invention, only a portion of the silicon film is allowed to react with the edge of the tungsten layer. The remainder of the silicon film is converted to silicon dioxide by subjecting the wafer to $O_2$, $H_2O$ vapor, or a wet forming gas (10% $H_2$ in $N_2$ with a trace of $H_2O$ vapor) in a furnace or in a rapid thermal processing chamber. Alternatively, the remainder of the silicon film may be converted to silicon dioxide by subjecting the wafer to $O_2$ or $O_3$ in a plasma reactor. In an alternative but equivalent embodiment of the process, the tungsten metal is converted to tungsten silicide and the remainder of the silicon film is converted to silicon dioxide using a single piece of equipment. This is done by first heating the wafer in a nitrogen-containing ambiance, and then ramping the temperature upward and replacing the nitrogen-containing ambiance with an oxidizing ambiance.

BRIEF DESCRIPTION OF THE DRAWINGS

FIG. 1 is a cross-sectional view of a word line stack incorporating an unpassivated tungsten layer;

FIG. 2 is a cross-sectional view of the word line stack of FIG. 1 following the blanket deposition of a conformal polycrystalline silicon film;

FIG. 3 is a cross-sectional view of the word line stack of FIG. 2 after reaction between the edges of the tungsten layer and the adjacent portions polycrystalline silicon layer;

FIG. 4 is a cross-sectional view of the word line stack of FIG. 3 following conversion of the remainder of the polycrystalline silicon film to a silicon dioxide film; and FIG. 5 is a cross-sectional view of the word line stack of FIG. 4 following removal of the silicon dioxide film.

PREFERRED EMBODIMENT OF THE INVENTION

FIG. 1 has been heretofore described as a word line stack 10 fabricated on a silicon substrate 15 and having an unpassivated tungsten metal layer 13. The structure of FIG. 1 is the starting point for various embodiments of a process for passivating the exposed edges of the tungsten metal layer 13 so that the word line stack may be further processed in an oxidizing ambiance without undergoing the conversion of the tungsten metal layer 13 to the non-conductive compound, tungsten oxide. The various embodiments of the process proceed stepwise through FIG. 5.

Referring now to FIG. 2, a conformal polycrystalline silicon or amorphous silicon film 21 having a thickness of about 50 Å is blanket deposited, covering the upper surface and sidewalls of the word line stack and the substrate 15 as well. Deposition of the silicon film 21 may be accomplished by any available technique, such as chemical vapor deposition or plasma-enhanced chemical vapor deposition.

Referring now to FIG. 3, the wafer is heated so that the tungsten at both edges of tungsten layer 13 that is in contact with the silicon film 21 is converted to tungsten silicide by subjecting the wafer to elevated temperature in the presence of a gas which does not react with silicon at the silicidation reaction temperature. Gases such as diatomic nitrogen, helium and argon are examples. In a preferred embodiment of the invention, the silicidation reaction is terminated before the entire thickness of the silicon film 21 that is adjacent each edge of tungsten layer 13 is consumed. In any case, tungsten silicide strips 31 are formed along each of the two formerly exposed edges of the tungsten layer 13.

Referring now to FIG. 4, the remainder of the silicon film 21, both those portions which are immediately adjacent the newly formed tungsten silicide strips 21 as well as those portions which coat the remainder of the word line stack and the substrate 15 are converted to a silicon dioxide layer 41 by subjecting the wafer to elevated temperature in an oxidizing ambiance. This step may be performed in a furnace or rapid thermal processing chamber in the presence of diatomic oxygen or ozone. Alternatively, the step may be performed by heating the wafer in a plasma reactor in the presence of plasma generated from diatomic oxygen or ozone gases. In an alternative equivalent embodiment of the process, the tungsten silicide strips 31 and silicon dioxide layer 41 are formed in a single piece of equipment. This is done by first heating the wafer in a nitrogen-containing ambiance, and then ramping the temperature upwardly and replacing the nitrogen-containing ambiance with an oxidizing ambiance.

Referring now to FIG. 5, the process is completed by removing the silicon dioxide film 41 with a wet etch. A wet etch is preferred over a plasma etch because wet etches typically have greater selectivity and also because wet etches tend to effect less substrate damage.

Although only several embodiments of the improved anneal process are disclosed herein, it will be obvious to those having ordinary skill in the art of integrated circuit manufacture, that changes and modifications may be made thereto without departing from the scope and the spirit of the invention as hereinafter claimed.

We claim:

1. A method for passivating the edges of a metal layer within a word line stack, said stack having been fabricated on a silicon substrate on which had been formed a gate dielectric layer, said stack having a conductively-doped polycrystalline silicon layer overlying and in contact with the gate dielectric layer, and the metal layer overlying and in electrical contact with the polycrystalline silicon layer, and a dielectric capping layer overlying the metal layer, said stack having sidewalls formed from an edge of each of the constituent layers, said method comprising the steps of:

(a) depositing a silicon film on the sidewalls of the word line stack; and (b) converting metal atoms on the edge of the metal layer to a metal silicide.

2. The method of claim 1, wherein said silicon film is polycrystalline.

3. The method of claim 1, wherein said silicon film is amorphous.

4. The method of claim 1, wherein said metal is a refractory metal selected from the group consisting of tungsten, titanium, platinum, paladium, cobalt, molybdenum, nickel, rhodium and iridium.

5. The method of claim 1, wherein said metal is an alloy comprising at least one of the refractory metals selected from the group consisting of tungsten, titanium, platinum, paladium, cobalt, molybdenum, nickel, rhodium and iridium.

6. The method of claim 1, wherein the step of converting metal atoms on the edges of the metal layer to metal silicide is accomplished by subjecting the film-covered stack to elevated temperature in an inert ambiance.

7. The method of claim 6, wherein the inert ambiance comprises at least one gas selected from the group consisting of diatomic nitrogen, argon, and helium.

8. The method of claim 1, wherein said gate dielectric layer is thermally-grown silicon dioxide and the capping layer is predominantly silicon dioxide.

9. The method of claim 1, which further comprises the step of converting a remaining portion of the polycrystalline silicon film to a silicon dioxide film.

10. The method of claim 9, wherein the step of converting a remaining portion to a silicon dioxide film is accomplished by subjecting the film-covered stack to elevated temperature within a range of 700° to 1,000° C. in the presence of an oxidizing ambiance.

11. The method of claim 7, which further comprises the step of removing the silicon dioxide film which was formed from silicon atoms in the deposited polycrystalline silicon film.

12. A method of fabricating a passivated word line stack on a silicon substrate, said method comprising the steps of:
 (a) oxidizing the substrate to form a gate dielectric layer on an upper surface of the substrate;
 (b) depositing a silicon layer on the gate dielectric layer;
 (c) forming a barrier layer on the polycrystalline silicon layer, said barrier layer being impermeable to both silicon and metal atoms;
 (d) depositing a metal layer on the barrier layer;
 (e) depositing a dielectric capping layer on the metal layer;
 (f) patterning the deposited layers and barrier layer to form an unpassivated word line stack, said stack having sidewalls formed from an edge of each of the constituent layers;
 (g) depositing a polycrystalline silicon film on the sidewalls of the stack; and
 (h) converting metal atoms on the edge of the metal layer to a metal silicide.

13. The method of claim 12, wherein said silicon film is polycrystalline.

14. The method of claim 12, wherein said silicon film is amorphous.

15. The method of claim 12, wherein said metal is a refractory metal selected from the group consisting of tungsten, titanium, platinum, paladium, cobalt, molybdenum, nickel, rhodium and iridium.

16. The method of claim 12, wherein said metal is an alloy comprising at least one of the refractory metals selected from the group consisting of tungsten, titanium, platinum, paladium, cobalt, molybdenum, nickel, rhodium and iridium.

17. The method of claim 12, wherein the step of converting metal atoms on the edges of the metal layer to metal silicide is accomplished by subjecting the film-covered stack to elevated temperature in an inert ambiance.

18. The method of claim 12, wherein said gate dielectric layer is thermally-grown silicon dioxide and the capping layer is predominantly silicon dioxide.

19. The method of claim 12, which further comprises the step of converting a remaining portion of the polycrystalline silicon film to a silicon dioxide film.

20. The method of claim 19, which further comprises the step of removing the silicon dioxide layer which was formed from silicon atoms in the deposited polycrystalline film.

21. The method of claim 19, wherein the step of converting a remaining portion to a silicon dioxide film is accomplished by subjecting the silicon-film-covered stack to elevated temperature within a range of 700° to 1,000° C. in the presence of an oxidizing ambiance.

22. The method of claim 12, wherein the step of patterning is accomplished using a single masking step and a predominantly anisotropic etch step.

23. A method of passivating an exposed edge of a metal layer sandwiched between an overlying silicon dioxide capping layer and an underlying barrier layer, said method comprising the steps of:
 (a) covering the exposed edge with deposited silicon atoms; and
 (b) converting metal atoms on the edge of the metal layer to a metal silicide.

24. The method of claim 23, wherein said metal layer comprises tungsten, said capping layer comprises silicon dioxide, and said barrier layer is impermeable to both silicon atoms and tungsten atoms.

25. The method of claim 23, wherein the step of converting metal atoms on the edges of the metal layer to metal silicide is accomplished by subjecting the film-covered stack to elevated temperature in an inert ambiance.

26. The method of claim 23, which further comprises the step of converting a portion of the deposited silicon atoms to silicon dioxide.

27. The method of claim 26, which further comprises the step of removing the silicon dioxide formed from the deposited silicon atoms.

* * * * *